United States Patent [19]
Goto et al.

[11] Patent Number: 5,138,621
[45] Date of Patent: Aug. 11, 1992

[54] PUMPING LIGHT SOURCE DRIVE SYSTEM FOR AN OPTICAL AMPLIFIER

[75] Inventors: Koji Goto, Kawaguchi; Shu Yamamoto, Shiki; Yukio Horiuchi, Niza; Hiroharu Wakabayashi, Kawasaki, all of Japan

[73] Assignee: Kokusai Denshin Denwa Kabushiki Kaisha, Tokyo, Japan

[21] Appl. No.: 680,393

[22] Filed: Apr. 4, 1991

[30] Foreign Application Priority Data

Jul. 5, 1990 [JP] Japan ................... 2-178426

[51] Int. Cl.$^5$ .............................................. H01S 3/00
[52] U.S. Cl. .......................................... 372/38; 372/6; 372/69; 372/75
[58] Field of Search .................... 372/38, 6, 69, 70, 75

[56] References Cited

U.S. PATENT DOCUMENTS

| | | | |
|---|---|---|---|
| 4,439,861 | 3/1984 | Bradford | 372/70 |
| 4,835,782 | 5/1989 | Kaede et al. | 372/38 |
| 4,977,565 | 12/1990 | Shimosaka | 372/38 |
| 5,033,058 | 7/1991 | Cabaret et al. | 372/70 |

Primary Examiner—Leon Scott, Jr.
Attorney, Agent, or Firm—Emmanuel J. Lobato; Robert E. Burns

[57] ABSTRACT

A pumping light source drive system is disclosed for driving pumping light sources of an optical amplifier which is composed of a rare earth doped optical fiber doped with a rare earth element and said pumping light sources. The pumping light sources are always held in operation. The output signal power at the output of the rare earth doped optical fiber or the combined power of the pumping light sources is detected and compared with a predetermined reference power to control the output power of the pumping light sources, so that the output signal power or the combined power of the pumping light sources reaches a predetermined value.

12 Claims, 6 Drawing Sheets

PUMPING LIGHT SOURCE DRIVE SYSTEM FOR AN OPTICAL AMPLIFIER

BACKGROUND OF THE INVENTION

The present invention relates to a pumping light source drive system for an optical amplifier which is composed of a rare earth doped optical fiber and a pumping light source therefor.

The optical amplifier made up of a rare earth doped optical fiber and a pumping light source therefor has the advantages of the independency of gain from polarized light and a small coupling loss.

For example, in a case where an optical amplifier using the rare earth doped optical fiber is applied to an optical submarine cable system, a service life of about 25 years is required of the optical amplifier, but when the living pumping light source is always driven for the high-output operation as in the prior art, the optical amplifier has a relatively short life, and hence is low in reliability.

SUMMARY OF THE INVENTION

An object of the invention is to provide an optical amplifier drive system which lengthens the life of the pumping light source and permits realization of a highly reliable optical amplifier.

To attain the above objective, the pumping light source drive system for an optical amplifier according to the present invention in which the optical amplifier is composed of a rare earth doped optical fiber and a pumping light source for pumping the rare earth doped fiber, comprises:

a plurality of such pumping light sources always held in operation;

combining means for combining the output power of the plurality of pumping light sources; and compare and control means which detects, as a detected output, the power of the output signal at the output of the rare earth doped optical fiber or the combined power of the pumping light sources by the combining means, compares the detected output with predetermined reference power and controls the output power of the pumping light sources accordingly;

wherein the outputs of the pumping light sources are controlled by the compare and control means so that the output signal power or the combined power of the pumping light sources may reach a predetermined level.

With such an arrangement, the output of each pumping light source can be reduced by half in case of using two pumping light sources as compared with the output provided when a single pumping light source is used as in the prior art, accordingly, the life of each pumping light source can be prolonged. At the same time, the provision of a parallel redundancy system permits enhancement of the reliability of the optical amplifier.

BRIEF DESCRIPTION OF THE DRAWINGS

The present invention will be described in detail below in comparison with prior art with reference to accompanying drawings, in which.

DETAILED DESCRIPTION

To make differences between the present invention and prior art clear, prior art will first be described.

Figure 6:
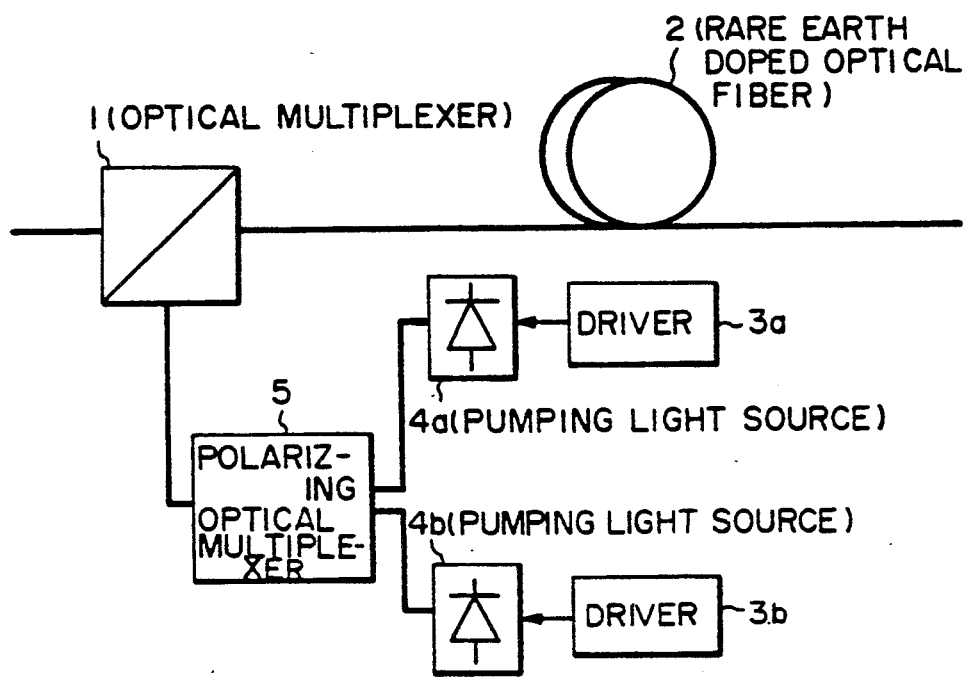
FIG. 6 is block diagram showing a conventional pumping light source drive system for an optical amplifier.
Figure 7:
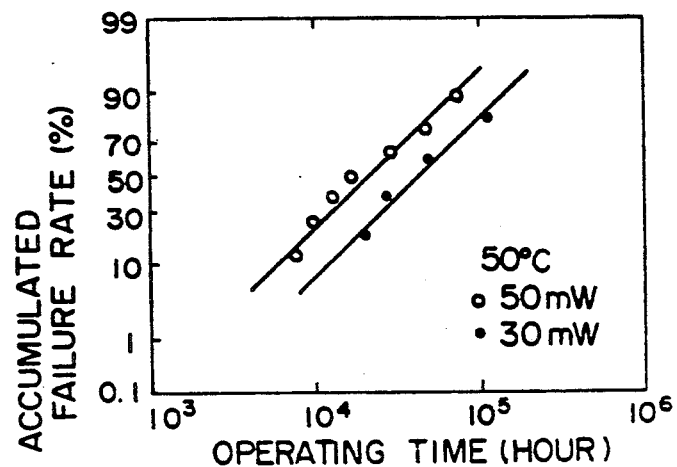
FIG. 7 is a graph showing the relationship between the operating time and the accumulated failure rate of a conventional optical amplifier with respect to its output power.

FIG. 6 shows a conventional system for driving the pumping light source of the optical amplifier [1990 Spring National Conference of Electronics, Information and Communication Engineers of Japan, Digest of Papers, Vol. 4, 1990, Masaharu Horiguchi, et al., Discussion of 1.48 $\mu$m Band LD Pumping Rare Earth Doped Optical Fiber Amplifier Module, p. 398]. In FIG. 6 reference numeral 1 indicates an optical multiplexer for coupling signal light and pumping light, 2 a rare earth doped optical fiber doped with a rare earth element such as Er, 3a and 3b drive circuits for oscillating a pumping light source, 4a and 4b living and stand-by light sources for pumping the rare earth element doped in the optical fiber 2, and 5 a polarizing light multiplexer for coupling the outputs of the pumping light sources 4a and 4b of different planes of polarization.

Conventionally, one of the two pumping light sources is used as a living pumping light source and the other as a stand-by light source. The living pumping light source 4a (or 4b) is always activated to provide a high output ranging from 10 to 50 mW, by which the rare earth element doped in the optical fiber 2 to amplify the signal light combined by the optical multiplexer 1. This system employs a hot-standy or cold-standy pumping light source 4b (or 4a) to make the pumping light source redundant-structured, thus enhancing the reliability of the optical amplifier.

However, the life of the pumping light source 4a (or 4b) is related directly to its light output and the conventional drive system drives one living pumping light source for a high-output operation, and hence has a defect such that the life (i.e. operating time) of the pumping light source is shortened. FIG. 6 is a graph showing the relationship between the operating time and the accumulated failure rate of the pumping light source 4, using its output power as a parameter. As shown, when the power of the pumping light source is raised from 30 mW to 50 mW, the accumulated failure rate in the case of 50 mW output is remarkably higher than in case of the 30 mW output for the same length of operating time (JOURNAL OF LIGHTWAVE TECHNOLOGY, VOL. LT-5, NO. 9, SEP. 1987, IEE). For example, in a case where an optical amplifier using the rare earth doped optical fiber is applied to an optical submarine cable system, a service life of about 25 years is required of the optical amplifier, but when the living pumping light source 4a (or 4b) is always driven for the high-output operation as in the prior art, the optical amplifier has a relatively short life, and hence is low in reliability.

The present invention will now be described.

Figure 1:
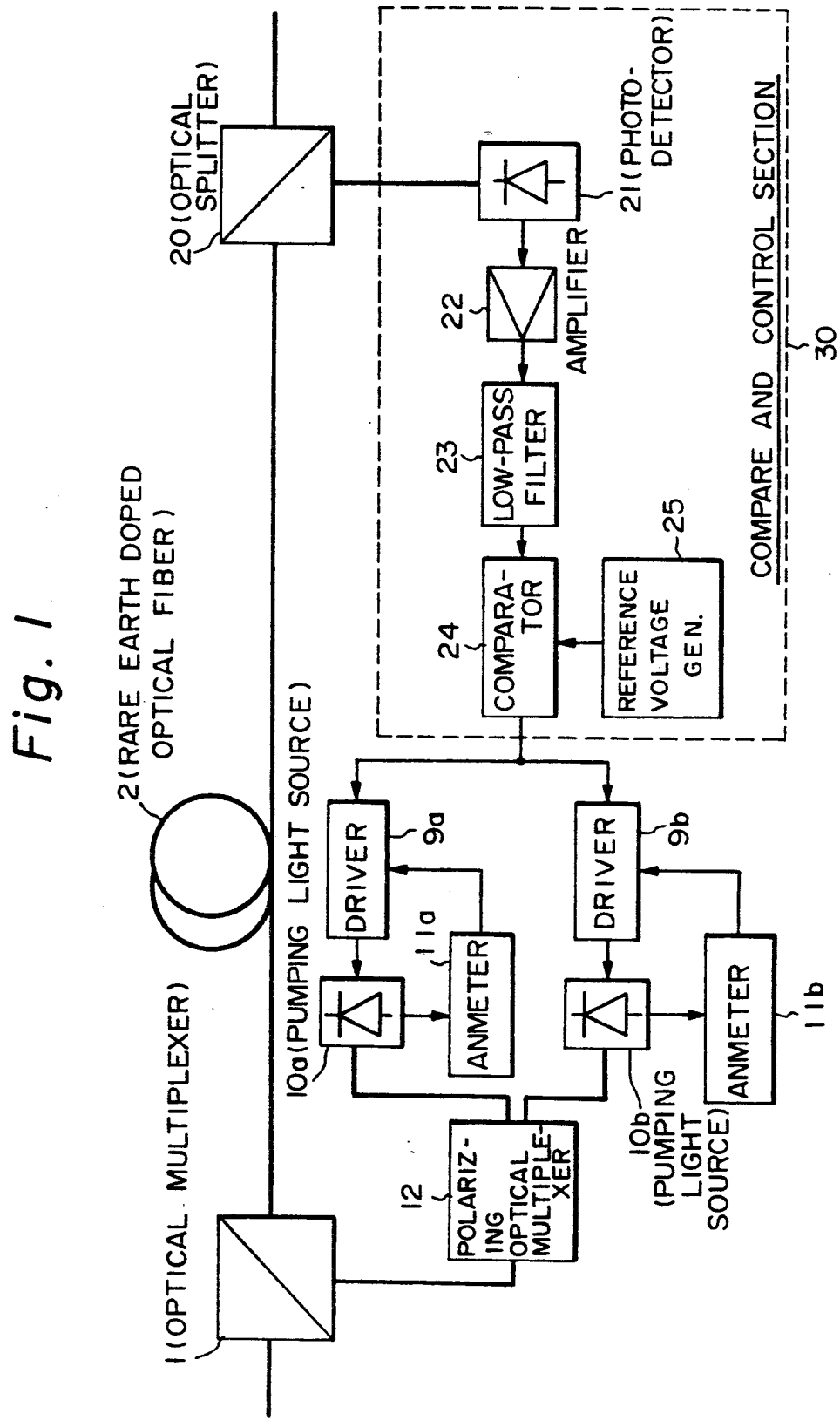
FIGS. 1 through 5 are block diagrams illustrating pumping light source driving systems for an optical amplifier according to first to fifth embodiments of the present invention.

FIG. 1 illustrates in block form a pumping light source drive system for an optical amplifier according to a first embodiment of the present invention. The pumping light source drive system of the present invention differs from the prior art example in that two pumping light sources 10a and 10b are always held in operation, the outputs of which are power combined by a polarizing optical multiplier 12, for pumping the rare earth doped optical fiber 2. According to the present invention, the two pumping light sources are activated at all times, the outputs of which are power combined to obtain a predetermined output level, and at the same time, a parallel redundancy system is formed.

In FIG. 1 the two pumping light sources 10a and 10b, which are controlled in their output power by drivers 9a and 9b, respectively, excite a rare earth element doped in the rare earth doped optical fiber 2. A portion of signal light which is the output signal amplified by propagation through the rare earth doped optical fiber 2 is split by an optical splitter 20 for input into a compare and control section 30 which includes a photodetector 21, an amplifier 22, a low-pass filter 23, a comparator 24 and a reference voltage generator 25 for generating a predetermined reference voltage. The two pumping light sources 10a and 10b are driven by the drivers 9a and 9b, respectively, and their outputs are power-combined by the polarizing optical multiplexer 12. The combined output thus obtained is combined by the optical multiplier 1 with the signal light and then pumps the rare earth doped optical fiber 2, amplifying the signal light. A portion of the signal light thus amplified is extracted by the optical spliiter 20 and is applied to the photodetector 21, the amplifier 22 and the low-pass filter 23 to detect the signal power level, which is compared by the comparator 24 with a predetermined power level from the reference voltage generator 25. When the signal power level is lower than the reference voltage, injection currents from the drivers 9a and 9b are increased, whereas in the opposite case the injection currents from the drivers 9a and 9b are decreased. By this, the light outputs of the pumping light sources are controlled to make the optical amplified signal power level constant at the output of the optical splitter 20. Currents for driving the pumping light sources are monitored by anmeters 11a and 11b, respectively, and when the driving current for one of the two pumping light sources exceeds a preset current value or becomes substantially zero, the light source is disconnected from the system and only the remaining light source is used to pump the rare earth doped optical fiber.

Consequently, the present invention affords a reduction approximately by half of the output power of the conventional pumping light source 10; so that the operating time of the optical amplifier can be improved about four-fold for the same accumulated failure rate, as is evident from FIG. 6.

While in the above the optical signal is extracted by the optical splitter 20 from the output signal, pumping light may also be extracted in place of the optical signal and monitored in the compare and control section 30.

EMBODIMENT 2

Figure 2:
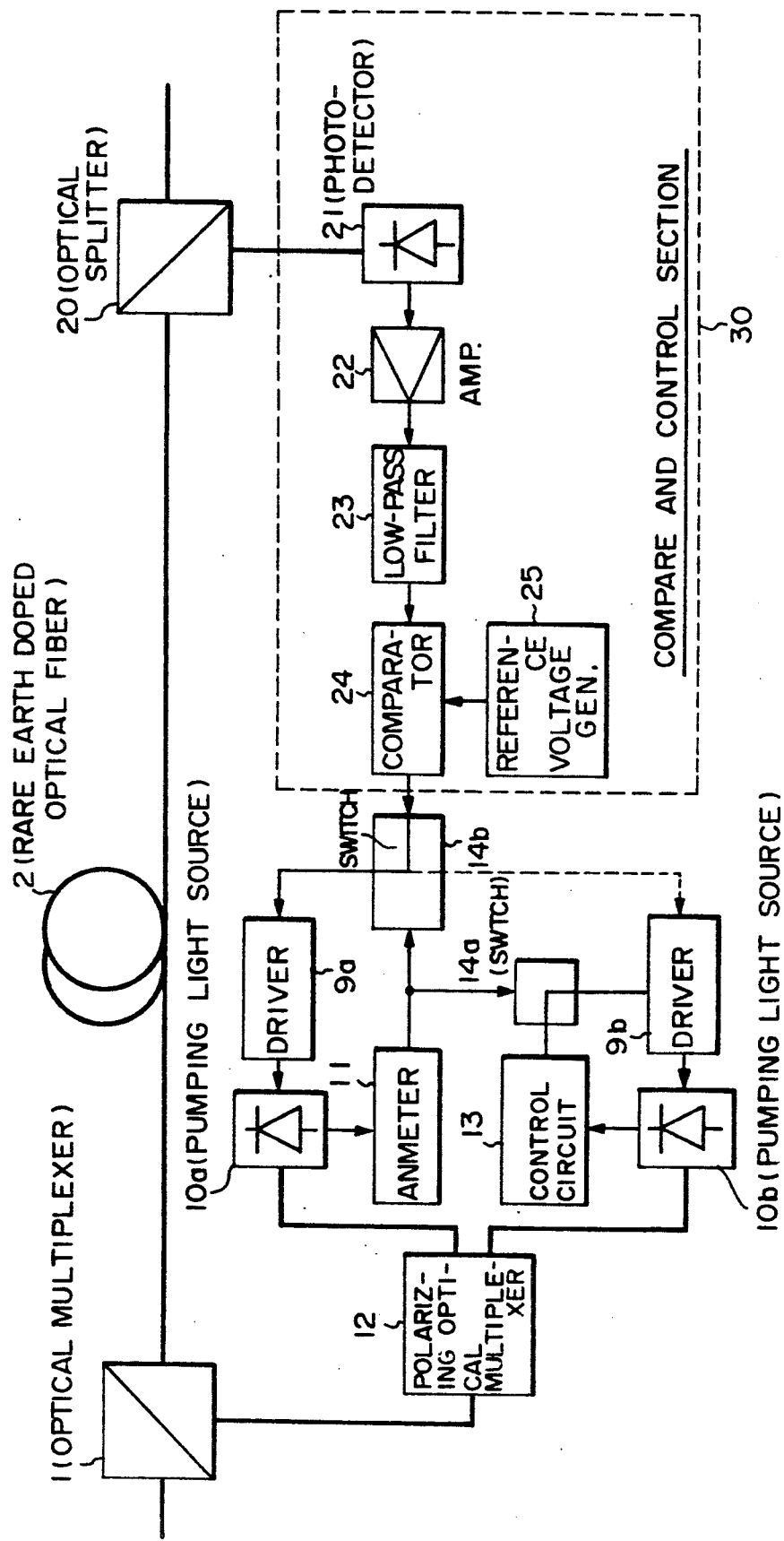

FIG. 2 illustrates in block form the pumping light source drive system for an optical amplifier according to a second embodiment of the present invention. This optical amplifier differs from the embodiment of FIG. 1 in that only one of the two pumping light sources is connected to the compare and control section 30 of the same function as in FIG. 1 and that the other light source is connected to a light source output control circuit 13 which functions to make the optical output of the light source constant. The light source output control circuit 13 monitors the optical power of rear monitor light of the pumping light source 10b and controls the injection current from the driver 9b so that the optical power may remain to be a low constant value. Further, the drive current to the pumping light source 10a is monitored by the anmeter 11, and when the drive current exceeds a present current value or becomes substantially zero, the pumping light source 10a is disconnected by a switch 14b from the compare and control section 30. At the same time, the other pumping light source 10b is disconnected by a switch 14a from the light source output control circuit 13 and is connected to the compare and control section 30.

EMBODIMENT 3

Figure 3:
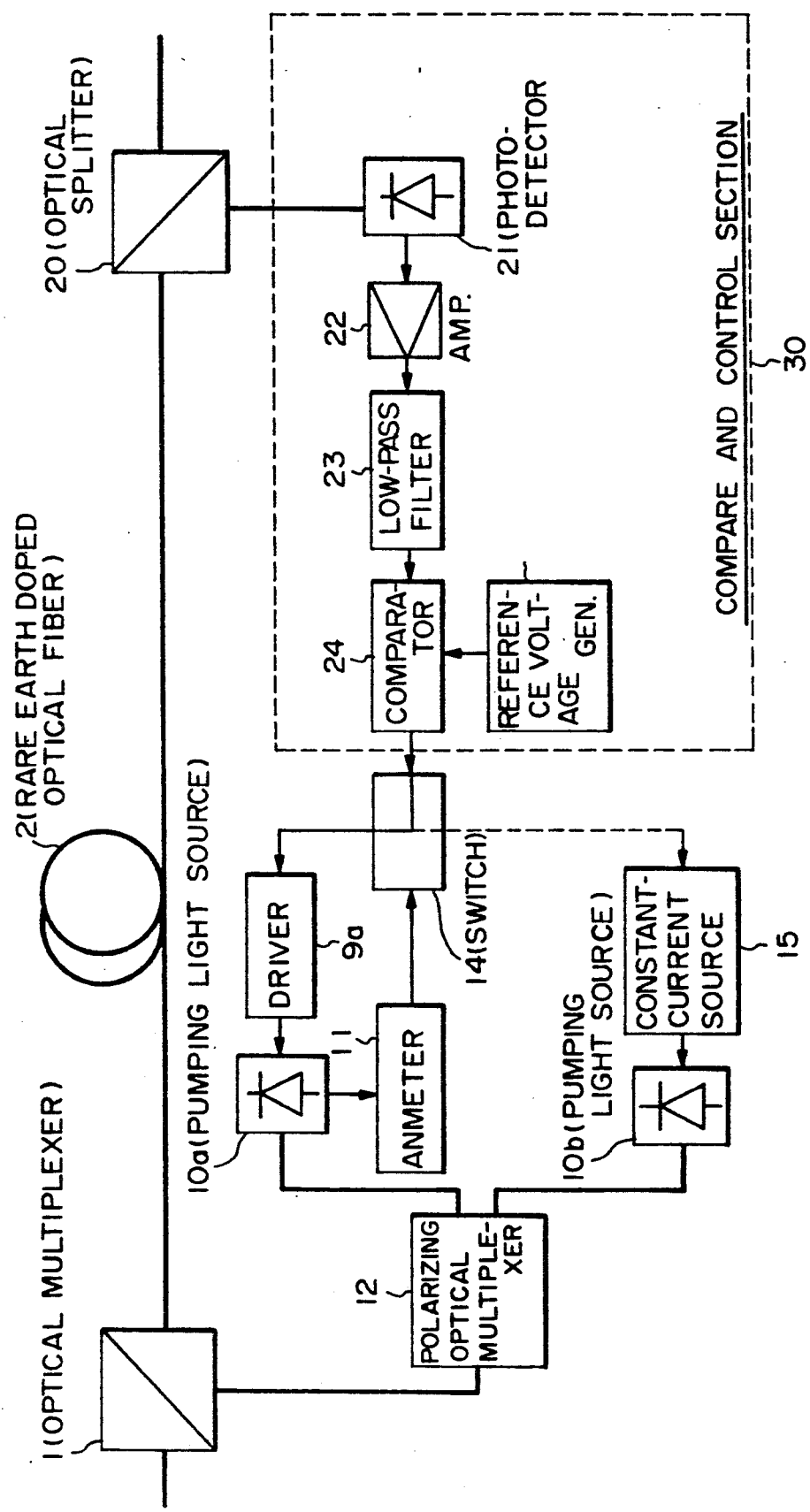

FIG. 3 illustrates in block form the pumping light source drive system for an optical amplifier according to a third embodiment of the present invention. This optical amplifier differs from the embodiment of FIG. 1 in that only one of the two pumping light sources is connected to the compare and control section 30 of the same function as in FIG. 1 and that the other light source is connected to a constant-current source 15. The drive current to the pumping light source 10a is monitored by the anmeter 11, and when the drive current exceeds a preset current value or becomes substantially zero, the pumping light source 10a is disconnected by the switch 14 from the compare and control section 30 and the other excitation light source 10b is connected to the compare and control section 30.

EMBODIMENT 4

Figure 4:
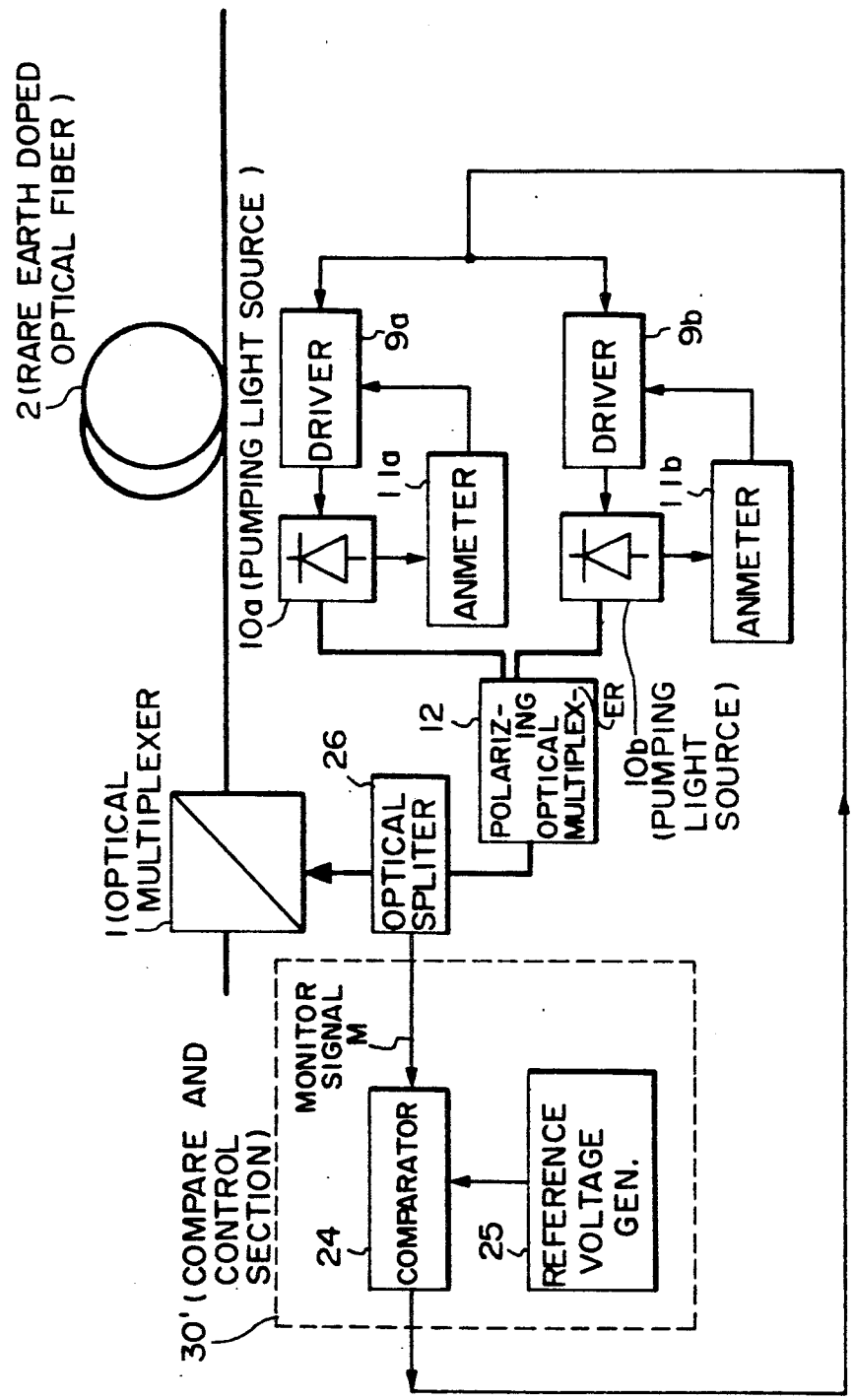

FIG. 4 illustrates in block form the pumping light source drive system for an optical amplifier according to a fourth embodiment of the present invention. In Embodiments 1 through 3 described above the amplified optical signal power, which is the output signal of the optical amplifier, is monitored by the compare and control section 30 and the pumping light sources 10a and 10b are controlled accordingly, whereas in Embodiment 4 a portion of combined power of the pumping light sources 10a and 10b is monitored directly by the compare and control section 30 and the pumping light sources 10a and 10b are controlled accordingly.

In FIG. 4, reference numeral 26 denotes an optical splitter which has a branching ratio smaller on a monitor signal M side, such as 1 (the monitor signal M):9 (the optical multiplexer 1 side) or 2:8, and 30' denotes a compare and control section in which the monitor signal M, which is a portion of combined power of the pumping light sources is compared by the comparator 24 with a reference voltage from the reference voltage generator 25 and by which the pumping light sources 10a and 10b are controlled. Thus, Embodiment 4 employs an arrangement in which a portion of the combined output of the pumping light sources 10a and 10b is compared directly with the reference signal from the reference voltage generator 25 and is controlled accordingly. Hence, the compare and control section 30' can be simplified. It is also possible to adopt an arrangement in which the compare and control section 30' is connected to at least one of the pumping light sources as in Embodiments 2 and 3, though not shown.

Although Embodiments 1 through 4 have been described, for the sake of brevity, in connection with the case of using the two pumping light sources 10a and 10b, it is also possible to employ more than two pumping light sources 10a, 10b, ... and combine together their outputs.

EMBODIMENT 5

Figure 5:
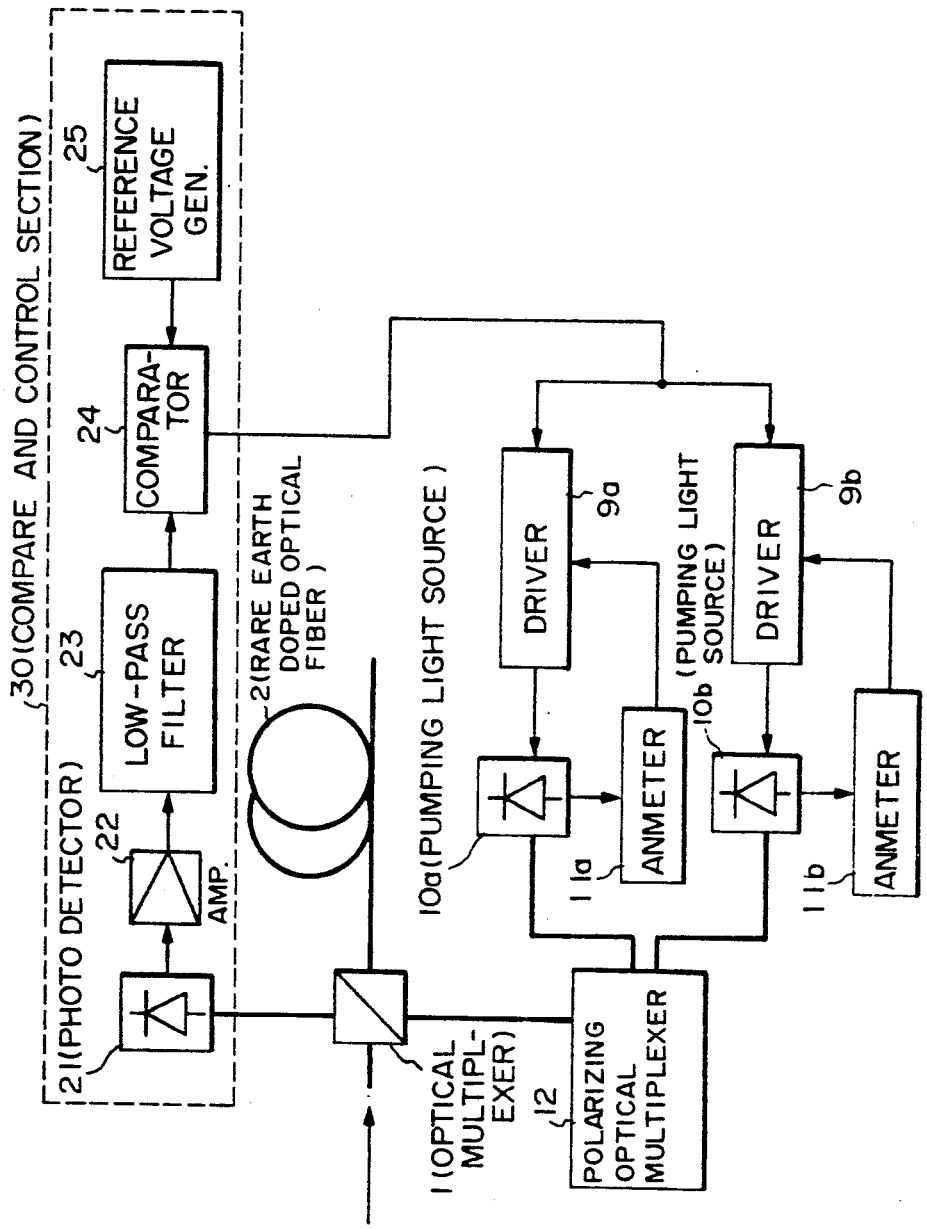

FIG. 5 illustrates in block form the pumping light source drive system for an optical amplifier according to a fifth embodiment of the present invention. In FIG. 5 a part of the combined power from the polarizing optical multiplexer 12 of the pumping light sources 10a and 10b is derived from the optical multiplexer 1 before the rare earth doped optical fiber 2, while a part of the combined power is derived from the optical splitter 20 after the rare earth doped optical fiber 2 in FIG. 4. Other parts in FIG. 5 are the same as those in FIG. 4.

As described above in detail, according to the present invention, the optical output of each pumping light source is reduced to prolong its service life and, at the same time, a parallel redundancy system is provided to increase the reliability of the optical amplifier.

By connecting the compare and control section 30 (or 30') to at least one pumping light source 10, the signal light output can be controlled to be constant.

Hence, the present invention is widely applicable not only to the optical amplifier employing a rare earth doped optical fiber but also to an optical fiber communication by an optical amplifying repeatered transmission utilizing such an optical amplifier; therefore, the invention is of great utility in practical use.

A plurality (more than two) of pumping light sources can be provided in accordance with the present invention. In this case, all of the plurality of pumping light sources can be controlled by the output of the compare and control section 30. Moreover, one or more of the pumping light sources can be controlled by the output of the compare and control section 30, while the output power of unconnected remainder of the pumping light sources being controlled to a low constant value as described with reference to FIGS. 2 and 3. In this case, the power of each of unconnected pumping light sources is substantially equal to one n-th (n: the number of all the pumping light sources) of the combined output power of the pumping light sources. In case of having three pumping light sources, the output power of each of the three pumping light sources can be reduced to one third in comparison with the output power of a high-output operated single pumping light source in the prior art.

What we claim is:

1. A pumping light source system for an optical amplifier, which is composed of a rare earth doped optical fiber doped with a rare earth element, comprising:
    a plurality of pumping light sources which are activated at all times,
    combining means for power combining together outputs of said plurality of pumping light sources to produce a combined power thereby pumping the rare earth doped optical fiber; and
    compare and control means which compares a detected output signal power of said rare earth doped optical fiber with a predetermined reference power to provide a comparison result and controls at least one of said pumping light sources by said comparison result so that said output signal power reaches a predetermined level.

2. A pumping light source system for an optical amplifier according to claim 1, wherein said result is applied to all of said plurality of pumping light sources.

3. A pumping light source system for an optical amplifier according to claim 1, wherein said result is applied to one or more of said plurality of pumping light sources, the output power of unapplied remainder of said plurality of pumping light sources being maintained to a low constant value without controlling by said result.

4. A pumping light source system for an optical amplifier, which is composed of a rare earth doped optical fiber doped with a rare earth element, comprising:
    a plurality of pumping light sources which are activated at all times;
    combining means for power combining together outputs of said plurality of pumping light sources to produce a combined power thereby pumping the rare earth doped optical fiber; and
    compare and control means which compares the combined power with a predetermined reference power to provide an error signal and controls at least one of said pumping light sources by said error signal so that said combined power reaches a predetermined level.

5. A pumping light source system for an optical amplifier according to claim 4, wherein said error signal is applied to all of said plurality of pumping light sources.

6. A pumping light source system for an optical amplifier according to claim 4, wherein said error signal is applied to one or more of said plurality of pumping light sources, the output power of unapplied remainder of said plurality of pumping light sources being maintained to a low constant value without controlling by said error signal.

7. A pumping light source drive system for an optical amplifier having a doped optical fiber doped with a rare earth element comprising,
    a plurality of pumping light sources optically coupled to said doped optical fiber continuously in operation applying optical pumping light power outputs to said doped optical fiber;
    combining means for optically combining the pumping light power outputs of said pumping light sources applied to said doped optical fiber;
    compare and control means having means for detecting signal light power output of said doped optical fiber or for alternatively detecting combined pumping light power output of said combining means; and
    said compare and control means having means for comparing detected signal light power output of the doped optical fiber or combined pumping light power output of said combining means with a reference power for controlling the pumping light power output as a function of said comparison to maintain the detected signal light power output at a predetermined level.

8. A pumping light source drive system for an optical amplifier having a doped optical fiber doped with a rare earth element according to claim 7, in which said compare and control means comprises a reference power generator for generating said reference power add a comparator for comparing a power level of said signal light power output extracted from the doped optical fiber with said reference power, said drive means for driving said pumping light sources individually with an output of said comparator resulting from said comparison.

9. A pumping light source drive system for an optical amplifier having a doped optical fiber doped with a rare earth element according to claim 8, in which said power generator comprises a voltage generator.

10. A pumping light source drive system for an optical amplifier having a doped optical fiber doped with a rare earth element according to claim 9, including an optical splitter for extracting a portion of the signal light power output of said doped optical fiber, and said portion establishing said power level of said signal light power output of said doped optical fiber extracted by said optical splitter.

11. A pumping light source drive system for an optical amplifier having a doped optical fiber doped with a rare earth element comprising, a plurality of pumping light sources optically coupled to said doped optical fiber continuously in operation applying optically pumping light power outputs to said doped optical fiber;

combining means for optically combining the pumping light power outputs of said pumping light sources applied to said doped optical fiber;

compare and control means having detecting means for detecting signal light power propagated along said doped optical fiber extracted from said doped optical fiber;

means for extracting signal light power from said doped optical fiber and applying it to said detecting means;

said compare and control means having comparator means for comparing a power level of extracted signal light power from said doped optical fiber and a reference power and means for generating said reference power; and means for applying results of said comparison to at least one of said pumping light sources for controlling the signal light power level propagated along said doped optical fiber as a function of results of said comparison.

12. A pumping light source drive system for an optical amplifier having a doped optical fiber doped with a rare earth element according to claim 11, in which said means for applying the results of said comparison applies said results to all said pumping light sources.

* * * * *